(12) United States Patent
Rippens et al.

(10) Patent No.: US 7,441,073 B2
(45) Date of Patent: *Oct. 21, 2008

(54) SYSTEM FOR INDICATING A PLUG POSITION FOR A MEMORY MODULE IN A MEMORY SYSTEM

(75) Inventors: Roger A. Rippens, Salt Point, NY (US); Donald J. Swietek, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/925,210

(22) Filed: Oct. 26, 2007

(65) Prior Publication Data

US 2008/0046650 A1 Feb. 21, 2008

Related U.S. Application Data

(63) Continuation of application No. 11/041,662, filed on Jan. 24, 2005, now Pat. No. 7,308,527.

(51) Int. Cl.
G06F 12/10 (2006.01)
(52) U.S. Cl. .................. 711/104; 711/105; 711/115
(58) Field of Classification Search .............. None
See application file for complete search history.

(56) References Cited

U.S. PATENT DOCUMENTS

| | | | |
|---|---|---|---|
| 4,433,387 A | 2/1984 | Dyer et al. | |
| 4,951,248 A | 8/1990 | Lynch | |
| 5,519,832 A | 5/1996 | Warchol | |
| 5,535,368 A | 7/1996 | Ho et al. | |
| 5,774,647 A | 6/1998 | Raynham et al. | |
| 6,003,110 A | 12/1999 | Brandt et al. | |
| 6,047,343 A | 4/2000 | Olarig | |
| 6,253,284 B1 | 6/2001 | Hsu | |
| 6,357,018 B1 | 3/2002 | Stuewe et al. | |
| 6,401,157 B1* | 6/2002 | Nguyen et al. | 710/302 |
| 6,629,855 B1* | 10/2003 | North et al. | 439/325 |
| 6,651,138 B2 | 11/2003 | Lai et al. | |
| 6,747,563 B2 | 6/2004 | Post et al. | |
| 6,751,740 B1 | 6/2004 | Robertson et al. | |
| 6,766,469 B2 | 7/2004 | Larson et al. | |
| 6,975,241 B2 | 12/2005 | Post et al. | |
| 2004/0024941 A1 | 2/2004 | Olarig et al. | |
| 2004/0243884 A1 | 12/2004 | Vu et al. | |
| 2005/0138465 A1 | 6/2005 | Depew et al. | |
| 2006/0085671 A1 | 4/2006 | Majni et al. | |

* cited by examiner

*Primary Examiner*—Kevin Verbrugge
(74) *Attorney, Agent, or Firm*—Cantor Colburn LLP; Lynn Augspurger

(57) ABSTRACT

A memory system including a first and second of set of socket pads adapted for connection to memory module continuity pins. The memory system also includes a first indicator corresponding to the first set of socket pads. The memory system also includes a second indicator corresponding to the second set of socket pads. The first indicator is active and the second indicator is inactive when the first and second set of socket pads are empty. The first indicator is inactive and the second indicator is inactive when then first and second set of socket pads contain the continuity pins. The first indicator is inactive and the second indicator is active when the first set of socket pads contain the continuity pins and the second set of socket pads is empty.

20 Claims, 10 Drawing Sheets

TYPICAL LARGE-SYSTEM MEMORY CONFIGURATION

SYSTEM FOR INDICATING A PLUG POSITION FOR A MEMORY MODULE IN A MEMORY SYSTEM

CROSS REFERENCE TO RELATED APPLICATION

This application is a continuation application of U.S. Ser. No. 11/041,662, filed Jan. 24, 2005, the contents of which are incorporated by reference herein in their entirety.

BACKGROUND OF THE INVENTION

The invention relates to computer memory systems and, more particularly, to indicating a plug position for a memory module in a memory system.

Computer memory subsystems have evolved over the years, but continue to retain many consistent attributes. Computer memory subsystems from the early 1980's, such as the one disclosed in U.S. Pat. No. 4,475,194 to LaVallee et al., of common assignment herewith, included a memory controller, a memory assembly (contemporarily called a basic storage module (BSM) by the inventors) with array devices, buffers, terminators and ancillary timing and control functions, as well as several point-to-point busses to permit each memory assembly to communicate with the memory controller via its own point-to-point address and data bus. FIG. 1 depicts an example of this early 1980 computer memory subsystem with two BSMs, a memory controller, a maintenance console, and point-to-point address and data busses connecting the BSMs and the memory controller.

FIG. 2, from U.S. Pat. No. 5,513,135 to Dell et al., of common assignment herewith, depicts an early synchronous memory module, which includes synchronous dynamic random access memories (DRAMs) 8, buffer devices 12, an optimized pinout, an interconnect and a capacitive decoupling method to facilitate operation. The patent also describes the use of clock re-drive on the module, using such devices as phase lock loops (PLLs).

FIG. 3, from U.S. Pat. No. 6,510,100 to Grundon et al., of common assignment herewith, depicts a simplified diagram and description of a memory system 10 that includes up to four registered dual inline memory modules (DIMMs) 40 on a traditional multi-drop stub bus channel. The subsystem includes a memory controller 20, an external clock buffer 30, registered DIMMs 40, an address bus 50, a control bus 60 and a data bus 70 with terminators 95 on the address bus 50 and data bus 70.

FIG. 4 depicts a 1990's memory subsystem which evolved from the structure in FIG. 1 and includes a memory controller 402, one or more high speed point-to-point channels 404, each connected to a bus-to-bus converter chip 406, and each having a synchronous memory interface 408 that enables connection to one or more registered DIMMs 410. In this implementation, the high speed, point-to-point channel 404 operated at twice the DRAM data rate, allowing the bus-to-bus converter chip 406 to operate one or two registered DIMM memory channels at the full DRAM data rate. Each registered DIMM included a PLL, registers, DRAMs, an electrically erasable programmable read-only memory (EEPROM) and terminators, in addition to other passive components.

As shown in FIG. 5, memory subsystems were often constructed with a memory controller connected either to a single memory module, or to two or more memory modules interconnected on a 'stub' bus. FIG. 5 is a simplified example of a multi-drop stub bus memory structure, similar to the one shown in FIG. 3. This structure offers a reasonable tradeoff between cost, performance, reliability and upgrade capability, but has inherent limits on the number of modules that may be attached to the stub bus. The limit on the number of modules that may be attached to the stub bus is directly related to the data rate of the information transferred over the bus. As data rates increase, the number and length of the stubs must be reduced to ensure robust memory operation. Increasing the speed of the bus generally results in a reduction in modules on the bus, with the optimal electrical interface being one in which a single module is directly connected to a single controller, or a point-to-point interface with few, if any, stubs that will result in reflections and impedance discontinuities. As most memory modules are sixty-four or seventy-two bits in data width, this structure also requires a large number of pins to transfer address, command, and data. One hundred and twenty pins are identified in FIG. 5 as being a representative pincount.

FIG. 6, from U.S. Pat. No. 4,723,120 to Petty, of common assignment herewith, is related to the application of a daisy chain structure in a multipoint communication structure that would otherwise require multiple ports, each connected via point-to-point interfaces to separate devices. By adopting a daisy chain structure, the controlling station can be produced with fewer ports (or channels), and each device on the channel can utilize standard upstream and downstream protocols, independent of their location in the daisy chain structure.

FIG. 7 represents a daisy chained memory bus, implemented consistent with the teachings in U.S. Pat. No. 4,723, 120. A memory controller 111 is connected to a memory bus 315, which further connects to a module 310a. The information on bus 315 is re-driven by the buffer on module 310a to the next module, 310b, which further re-drives the bus 315 to module positions denoted as 310n. Each module 310a includes a DRAM 311a and a buffer 320a. The bus 315 may be described as having a daisy chain structure, with each bus being point-to-point in nature.

Memory modules are logically wired to a memory controller in a sequential manner. The sequence in which the memory modules are plugged in may be critical for proper memory system operation. Currently, when adding a new memory module to a system board, it is not always easy to determine the correct placement of the new memory module. In addition, as the memory modules become longer in length with an increasing number of contacts, it is more of a concern that proper seating is accomplished when multiple memory modules are plugged in to a system board. Currently, it is not possible to be sure that proper seating has been accomplished without powering on the memory system.

BRIEF SUMMARY OF THE INVENTION

Exemplary embodiments of the present invention include a memory system including a first and second of set of socket pads. The first and second set of socket pads are adapted for connection to memory module continuity pins. The memory system also includes a first indicator corresponding to the first set of socket pads. The memory system also includes a second indicator corresponding to the second set of socket pads. The first indicator is active and the second indicator is inactive when the first and second set of socket pads are empty. The first indicator is inactive and the second indicator is inactive when then first and second set of socket pads contain the continuity pins. The first indicator is inactive and the second indicator is active when the first set of socket pads contain the continuity pins and the second set of socket pads is empty.

Additional exemplary embodiments include a cascaded interconnect system including one or more memory modules, a memory controller and a memory bus. The memory bus directly interconnects the memory modules and the memory controller by a packetized multi-transfer interface. The memory bus includes a system board with a first and second set of socket pads adapted for connection to continuity pins on the memory modules. The system board also includes a first indicator corresponding to the first set of socket pads and a second indicator corresponding to the second set of socket pads. The first indicator is active and the second indicator is inactive when the first and second set of socket pads are empty. The first indicator is inactive and the second indicator is inactive when then first and second set of socket pads contain the continuity pins. The first indicator is inactive and the second indicator is active when the first set of socket pads contain said continuity pins and the second set of socket pads is empty.

Further exemplary embodiments include a memory system including a set of socket pads adapted for connection to memory module continuity pins. The memory system also includes an indicator corresponding to the set of socket pads. The indicator is active when the set of socket pads is empty and the indicator is inactive when the set of socket pads contains the continuity pins.

BRIEF DESCRIPTION OF THE DRAWINGS

Referring now to the drawings wherein like elements are numbered alike in the several FIGURES.

DETAILED DESCRIPTION OF THE PREFERRED EMBODIMENTS

Exemplary embodiments of the present invention utilize an indicator, such as a light emitting diode (LED), to indicate that the current memory modules on a system board are properly seated and to indicate the placement of a next memory module on the system board. An exemplary embodiment of the present invention utilizes two continuity pins (also referred to herein as DIMM tabs) on each memory module to determine that each memory module is properly seated and to indicate the position for plugging in the next memory module (if any).

Figure 1:
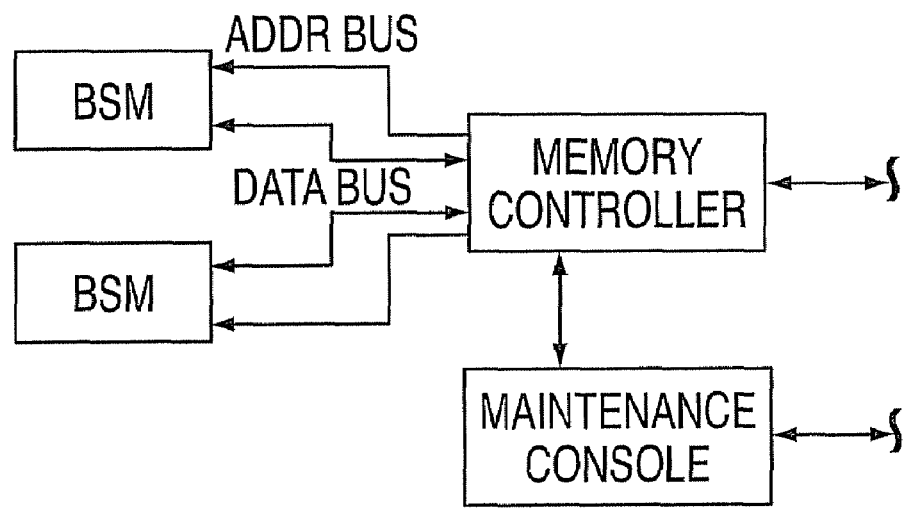
FIG. 1 depicts a prior art memory controller connected to two buffered memory assemblies via separate point-to-point links.
Figure 2:
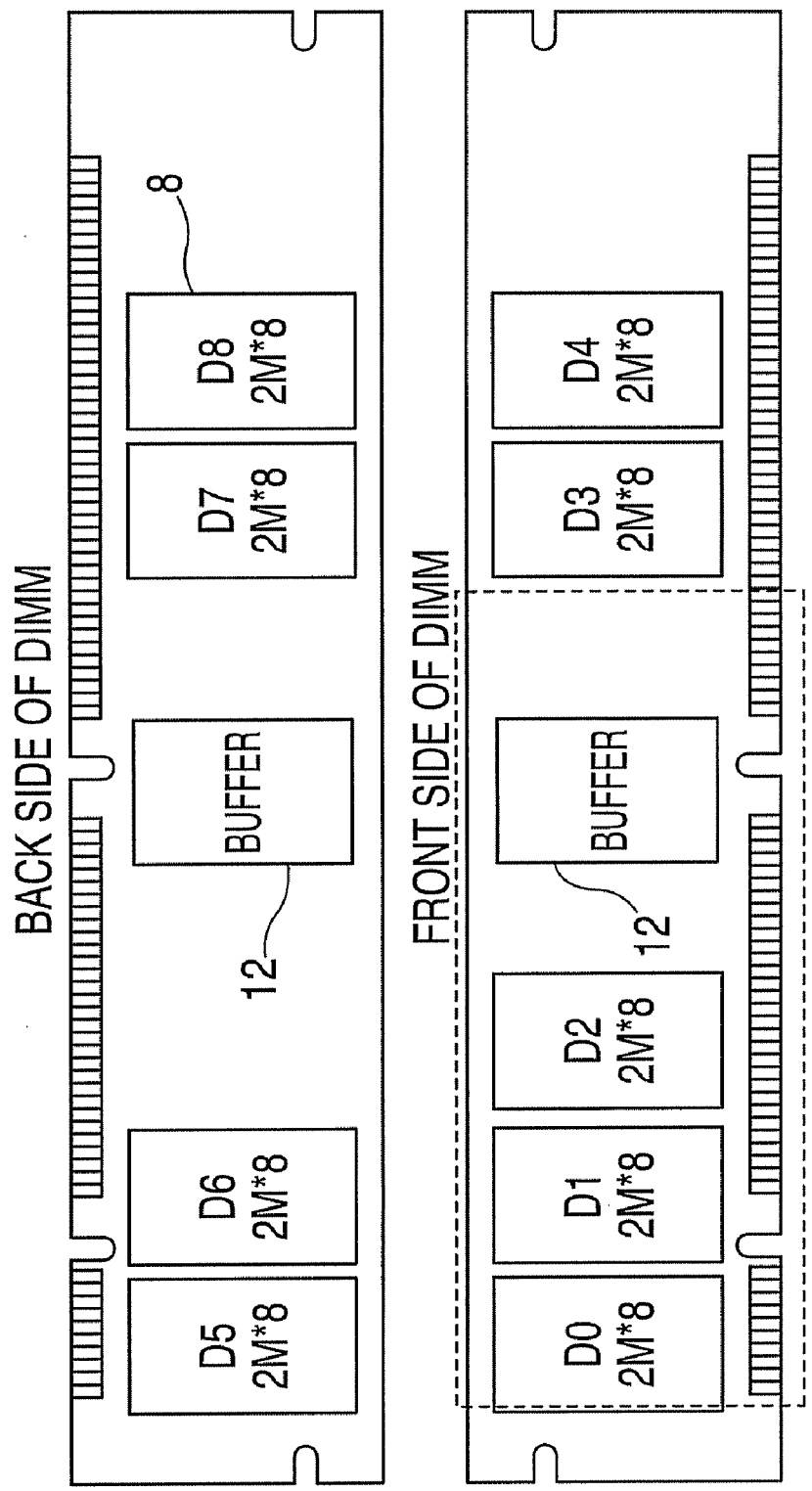
FIG. 2 depicts a prior art synchronous memory module with a buffer device.
Figure 3:
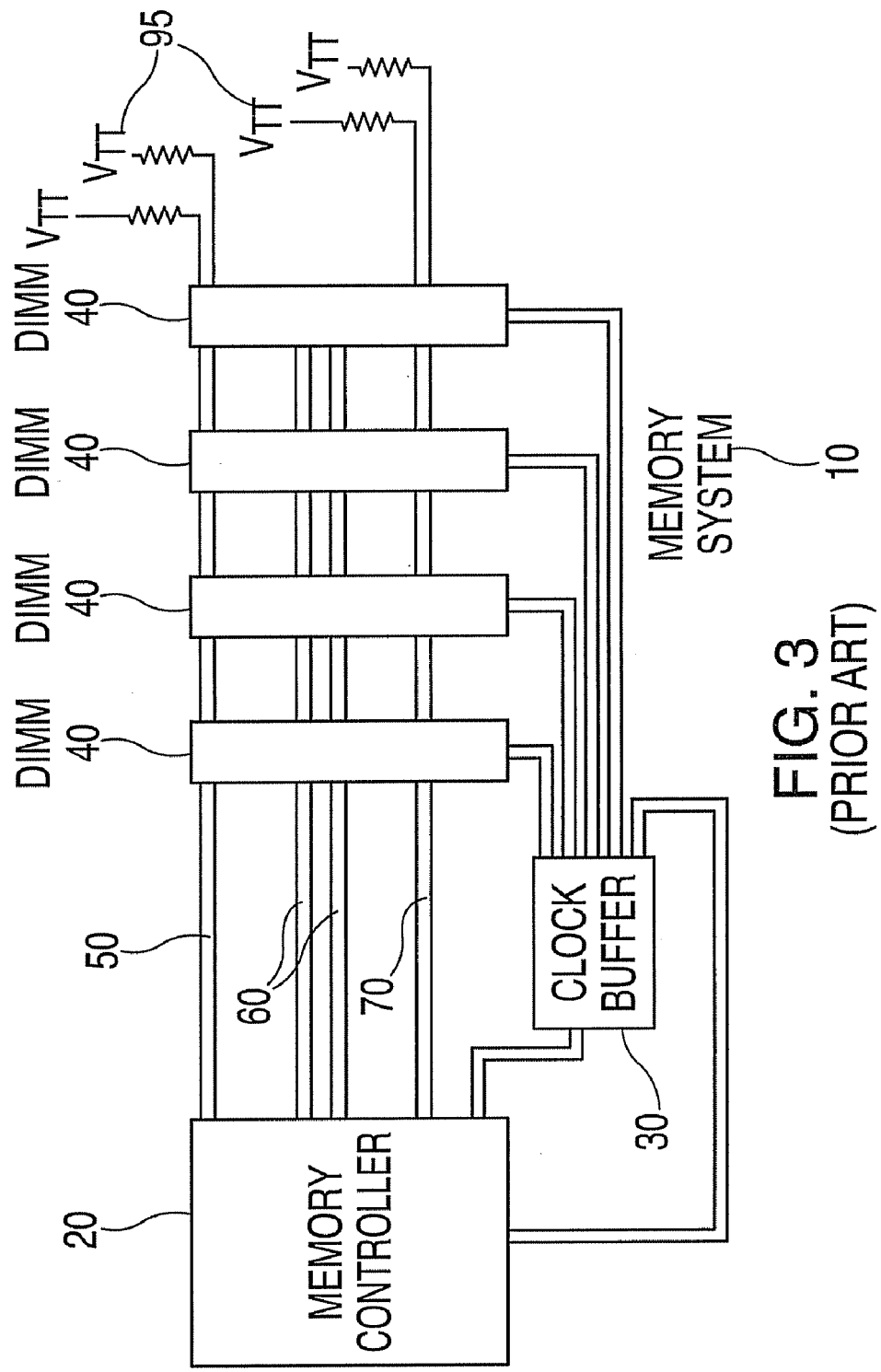
FIG. 3 depicts a prior art memory subsystem using registered DIMMs.
Figure 4:
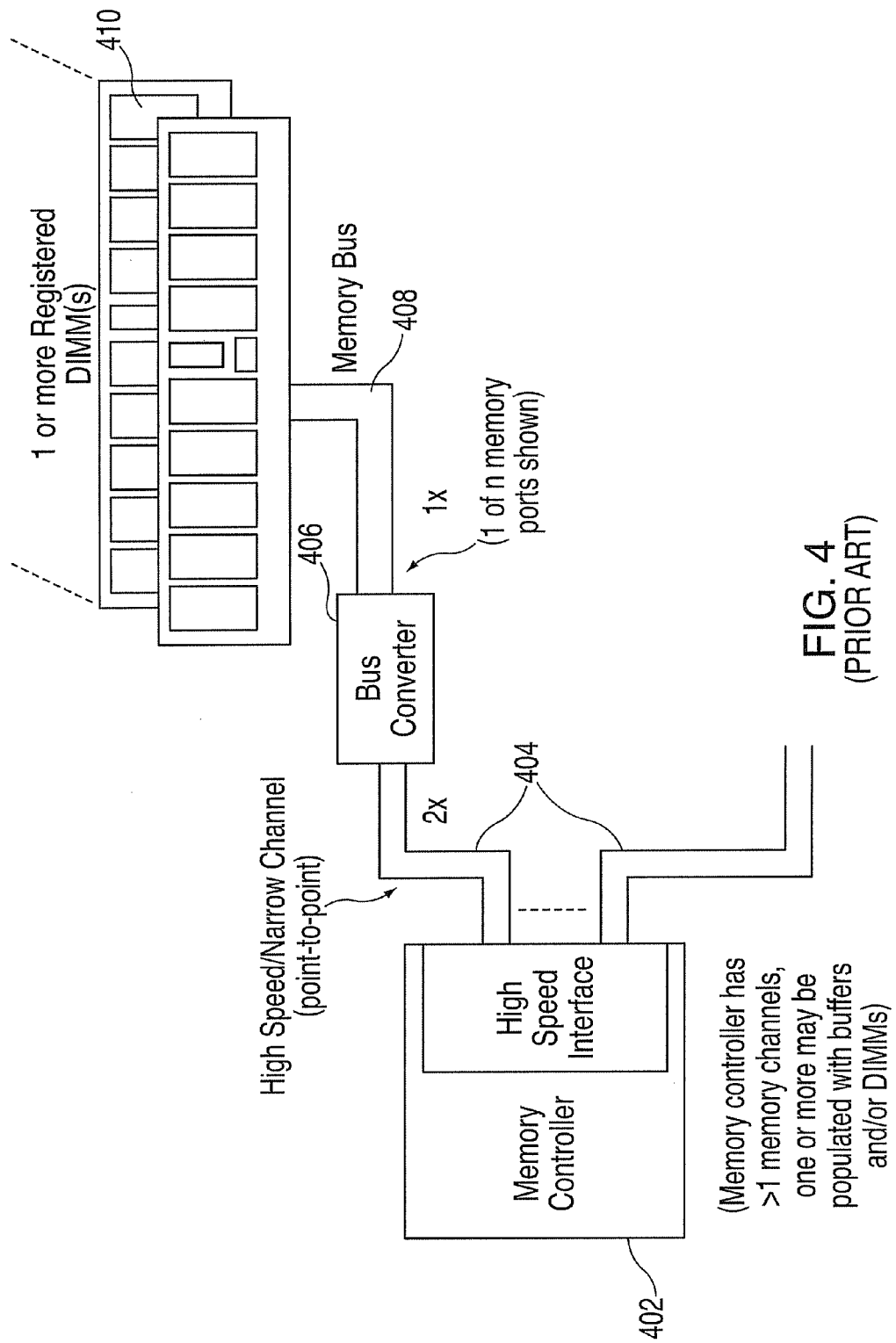
FIG. 4 depicts a prior art memory subsystem with point-to-point channels, registered DIMMs, and a 2:1 bus speed multiplier.
Figure 5:
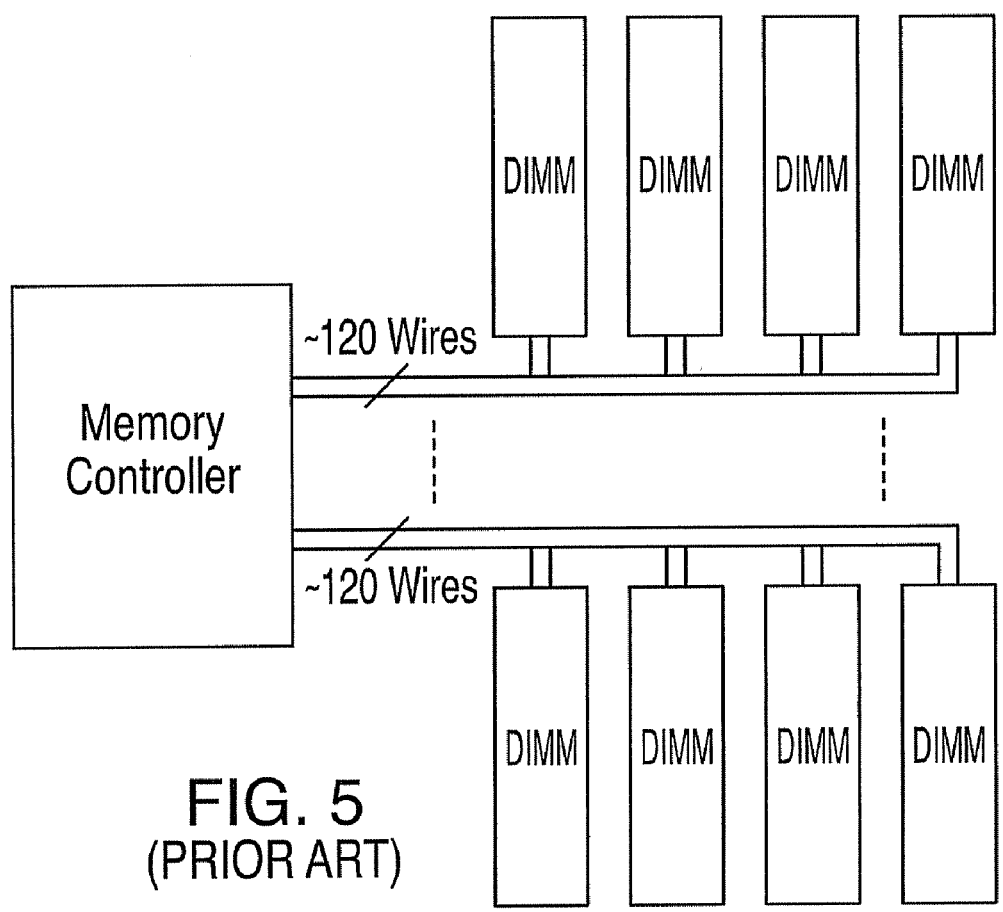
FIG. 5 depicts a prior art memory structure that utilizes a multidrop memory 'stub' bus.
Figure 6:
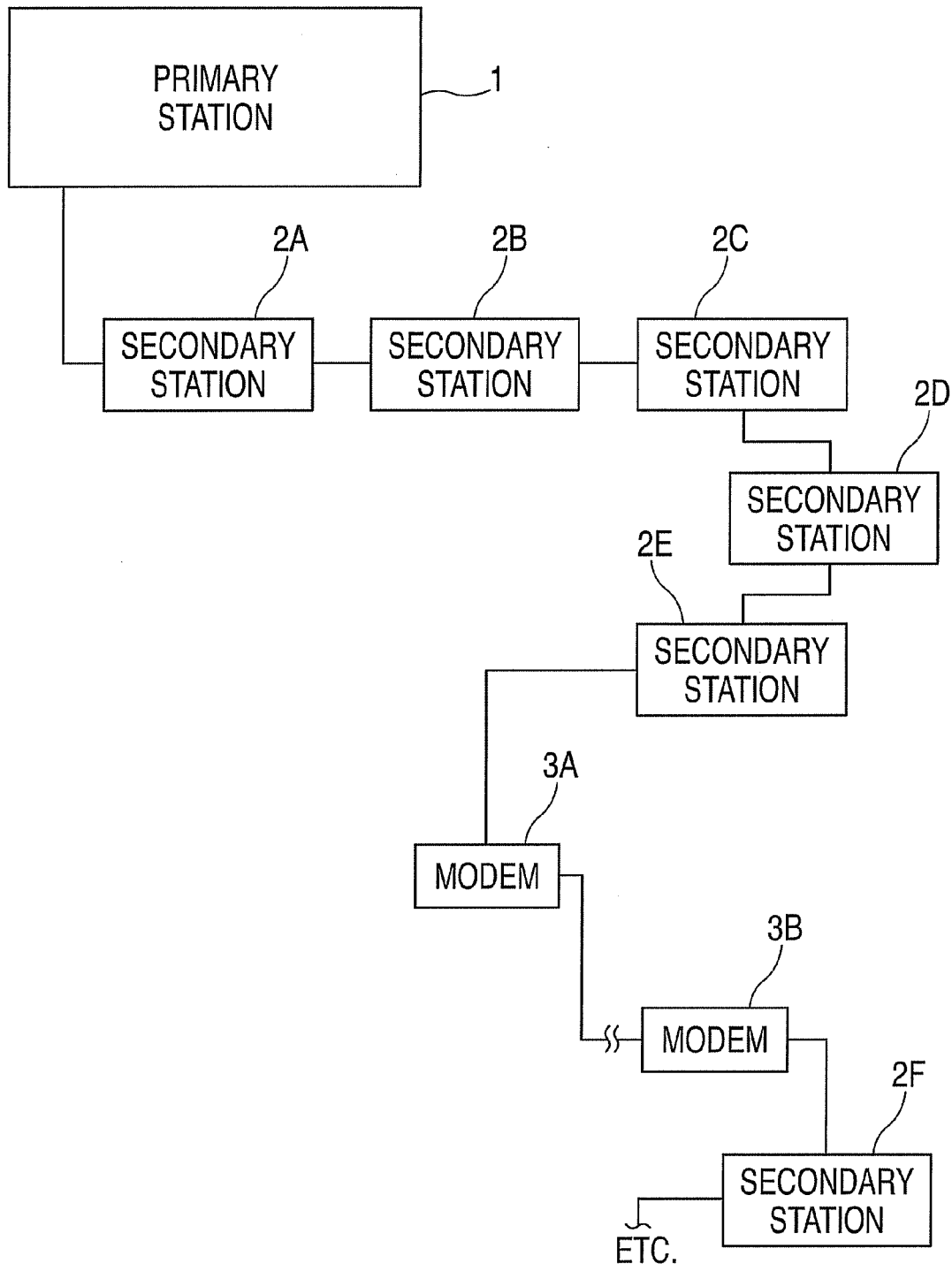
FIG. 6 depicts a prior art daisy chain structure in a multipoint communication structure that would otherwise require multiple ports.
Figure 7:
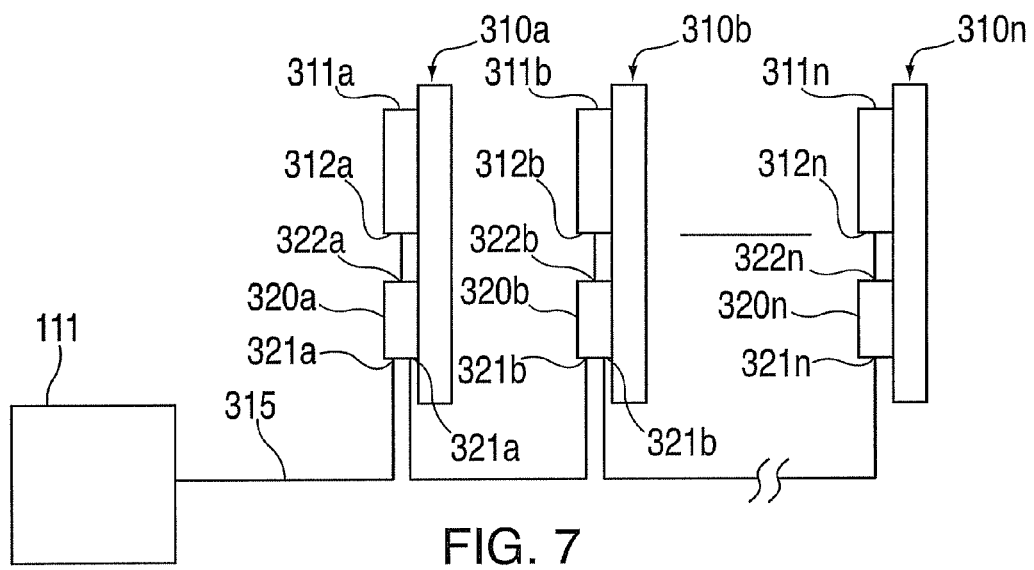
FIG. 7 depicts a prior art daisy chain connection between a memory controller and memory modules.
Figure 8:
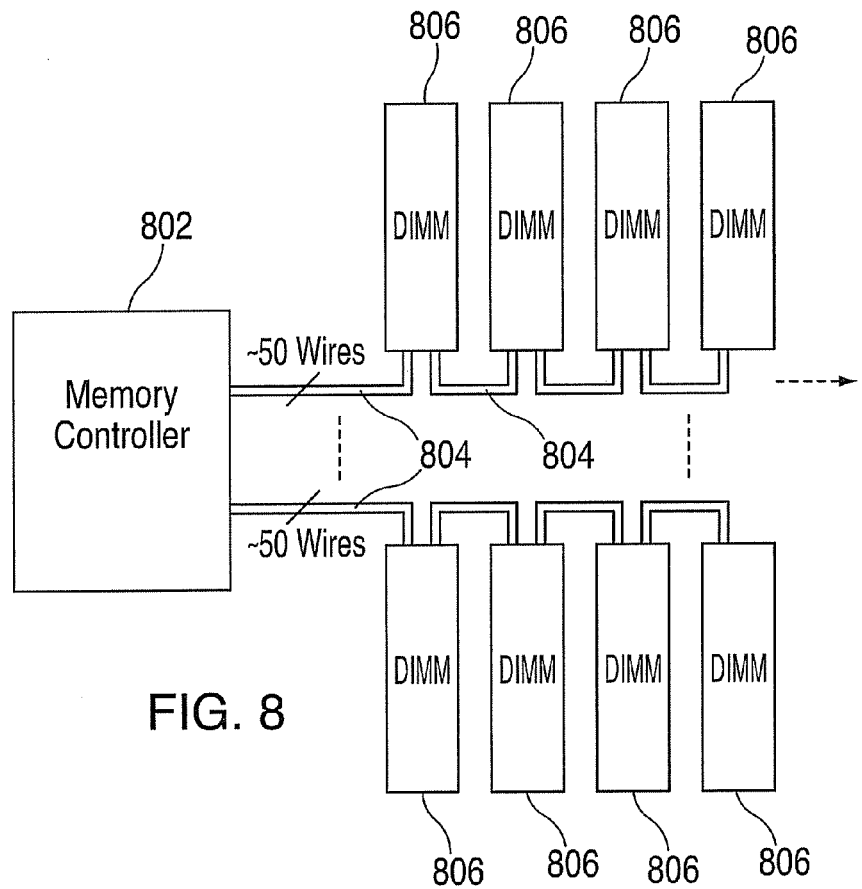
FIG. 8 depicts a cascaded memory structure that is utilized by exemplary embodiments of the present invention.

FIG. 8 depicts a cascaded memory structure that may be utilized by exemplary embodiments of the present invention when buffered memory modules 806 (e.g., the buffer device is included within the memory module 806) are in communication with a memory controller 802. This memory structure includes the memory controller 802 in communication with one or more memory modules 806 via a high speed point-to-point bus 804. Each bus 804 in the exemplary embodiment depicted in FIG. 8 includes approximately fifty high speed wires for the transfer of address, command, data and clocks. By using point-to-point busses as described in the aforementioned prior art, it is possible to optimize the bus design to permit significantly increased data rates, as well as to reduce the bus pincount by transferring data over multiple cycles. Whereas FIG. 4 depicts a memory subsystem with a two to one ratio between the data rate on any one of the busses connecting the memory controller to one of the bus converters (e.g., to 1,066 Mb/s per pin) versus any one of the busses between the bus converter and one or more memory modules (e.g., to 533 Mb/s per pin), an exemplary embodiment of the present invention, as depicted in FIG. 8, provides a four to one bus speed ratio to maximize bus efficiency and to minimize pincount.

Although point-to-point interconnects permit higher data rates, overall memory subsystem efficiency must be achieved by maintaining a reasonable number of memory modules 806 and memory devices per channel (historically four memory modules with four to thirty-six chips per memory module, but as high as eight memory modules per channel and as few as one memory module per channel). Using a point-to-point bus necessitates a bus re-drive function on each memory module. The bus re-drive function permits memory modules to be cascaded such that each memory module is interconnected to other memory modules, as well as to the memory controller 802.

Figure 9:
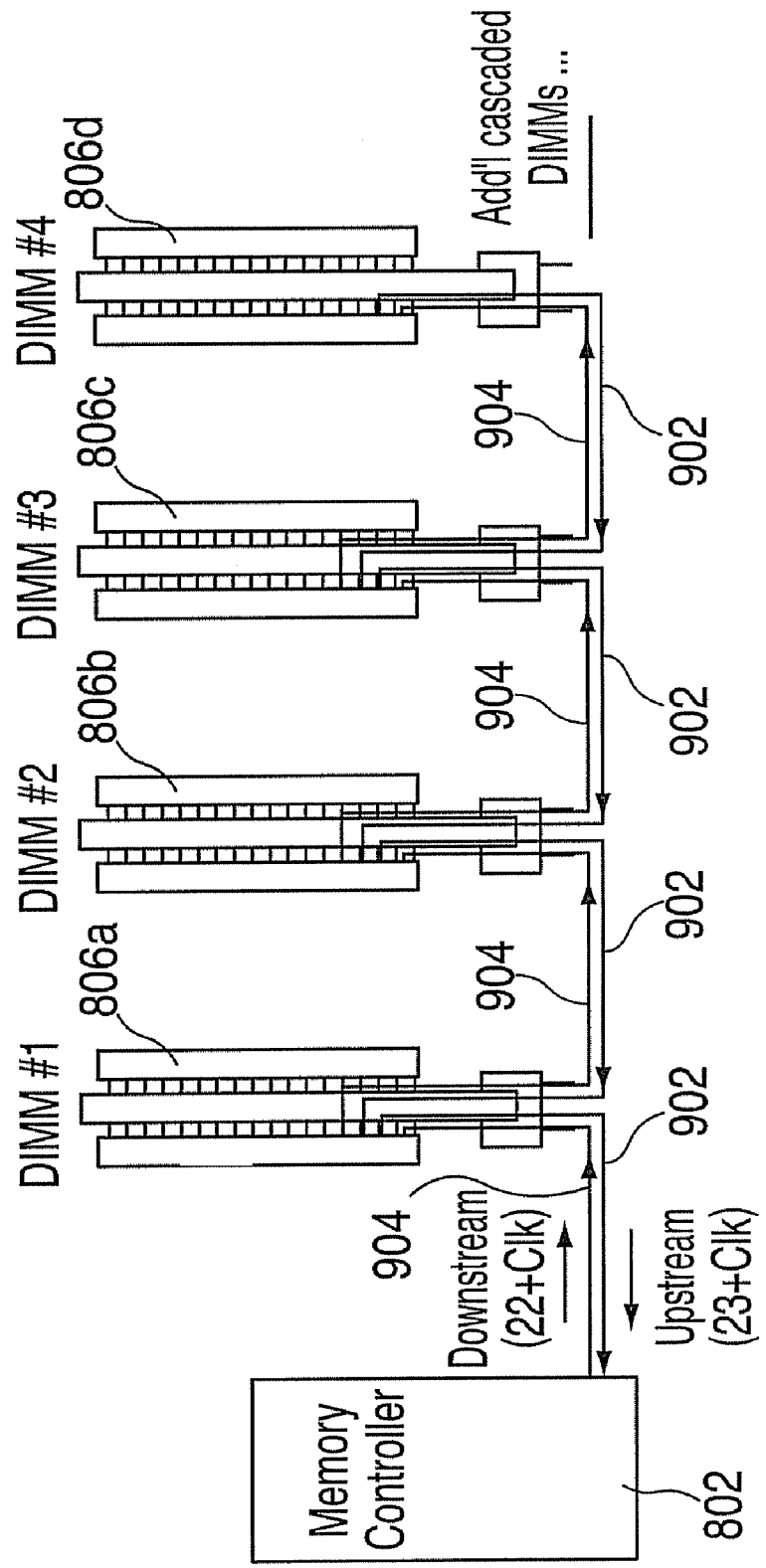
FIG. 9 depicts a memory structure with cascaded memory modules and unidirectional busses that is utilized by exemplary embodiments of the present invention.

FIG. 9 depicts a memory structure with cascaded memory modules and unidirectional busses that is utilized by exemplary embodiments of the present invention. One of the functions provided by the memory modules 806 in the cascade structure is a re-drive function to send signals on the memory bus to other memory modules 806 or to the memory controller 802. FIG. 9 includes the memory controller 802 and four memory modules 806a, 806b, 806c and 806d, on each of two memory busses (a downstream memory bus 904 and an upstream memory bus 902), connected to the memory controller 802 in either a direct or cascaded manner. Memory module 806a is connected to the memory controller 802 in a direct manner. Memory modules 806b, 806c and 806d are connected to the memory controller 802 in a cascaded manner.

An exemplary embodiment of the present invention includes two unidirectional busses between the memory controller 802 and memory module 806a ("DIMM #1"), as well as between each successive memory module 806b-d ("DIMM #2", "DIMM #3" and "DIMM #4") in the cascaded memory structure. The downstream memory bus 904 is comprised of twenty-two single-ended signals and a differential clock pair. The downstream memory bus 904 is used to transfer address, control, write data and bus-level error code correction (ECC) bits downstream from the memory controller 802, over several clock cycles, to one or more of the memory modules 806 installed on the cascaded memory channel. The upstream memory bus 902 is comprised of twenty-three single-ended signals and a differential clock pair, and is used to transfer read data and bus-level ECC bits upstream from the sourcing memory module 806 to the memory controller 802. Using this memory structure, and a four to one data rate multiplier between the DRAM data rate (e.g., 400 to 800 Mb/s per pin) and the unidirectional memory bus data rate (e.g., 1.6 to 3.2 Gb/s per pin), the memory controller 802 signal pincount, per memory channel, is reduced from approximately one hundred and twenty pins to about fifty pins.

Figure 10:
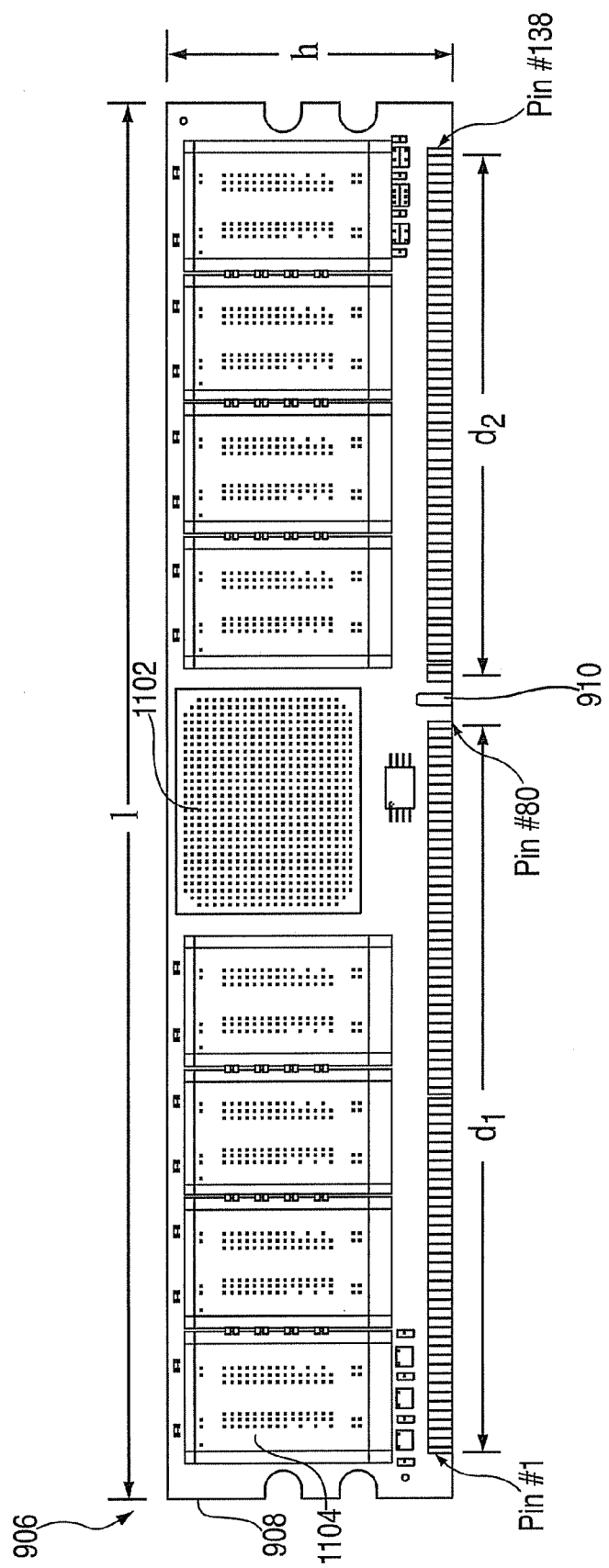
FIG. 10 is a front view of a 276-pin, buffered memory module (DIMM) that may be utilized by exemplary embodiments of the present invention.

FIG. 10 depicts a front view of a buffered memory module 806 that may be utilized by exemplary embodiments of the present invention. In exemplary embodiments of the present invention, each memory module 806 includes a blank card having dimensions of approximately six inches long by one and a half inches tall, eighteen DRAM positions, a buffer device 1002, and numerous small components as known in the art that are not shown (e.g., capacitors, resistors, EEPROM.) In an exemplary embodiment of the present invention, the dimension of the card is 5.97 inches long by 1.2 inches tall. In an exemplary embodiment of the present invention, the buffer device 1002 is located in the center region of the front side of the memory module 806, as depicted in FIG. 10. Synchronous DRAMS (SDRAMS) 1004 are located on either side of the multi-mode buffer device 1002, as well as on the backside of the memory module 806. The configuration may be utilized to facilitate high speed wiring to the multi-mode buffer device 1002 as well as signals from the buffer device 1002 to the SDRAMs 1004.

The DRAM package outline is a combination of a tall/narrow (i.e., rectangular) DRAM package and a short/wide (i.e., squarish) DRAM package. Thus configured, a single card design may accommodate either "tall" or "wide" DRAM device/package combinations, consistent with historical and projected device trends. Moreover, the buffer device 1002 is rectangular in shape, thereby permitting a minimum distance between high-speed package interconnects and the DIMM tab pins, as well as reducing the distance the high-speed signals must travel under the package to reach an available high-speed pin, when an optimal ground referencing structure is used.

As is also shown in FIG. 10, the location of a positioning key 810 (notch) is specifically shifted from the midpoint of the length, l, of the card 808 (with respect to prior generation models) in order to ensure that the DIMM (e.g., the memory module 806) cannot be fully inserted into a connector intended for a different module type. In addition, the positioning key location also prevents reverse insertion of the DIMM, and allows for a visual aid to the end-user regarding proper DIMM insertion. In the example illustrated, the positioning key 810 is located between pins 80/218 and 81/219. As such, the distance $d_1$ along the length, l, of the card 808 is larger than the distance $d_2$.

Figure 11:
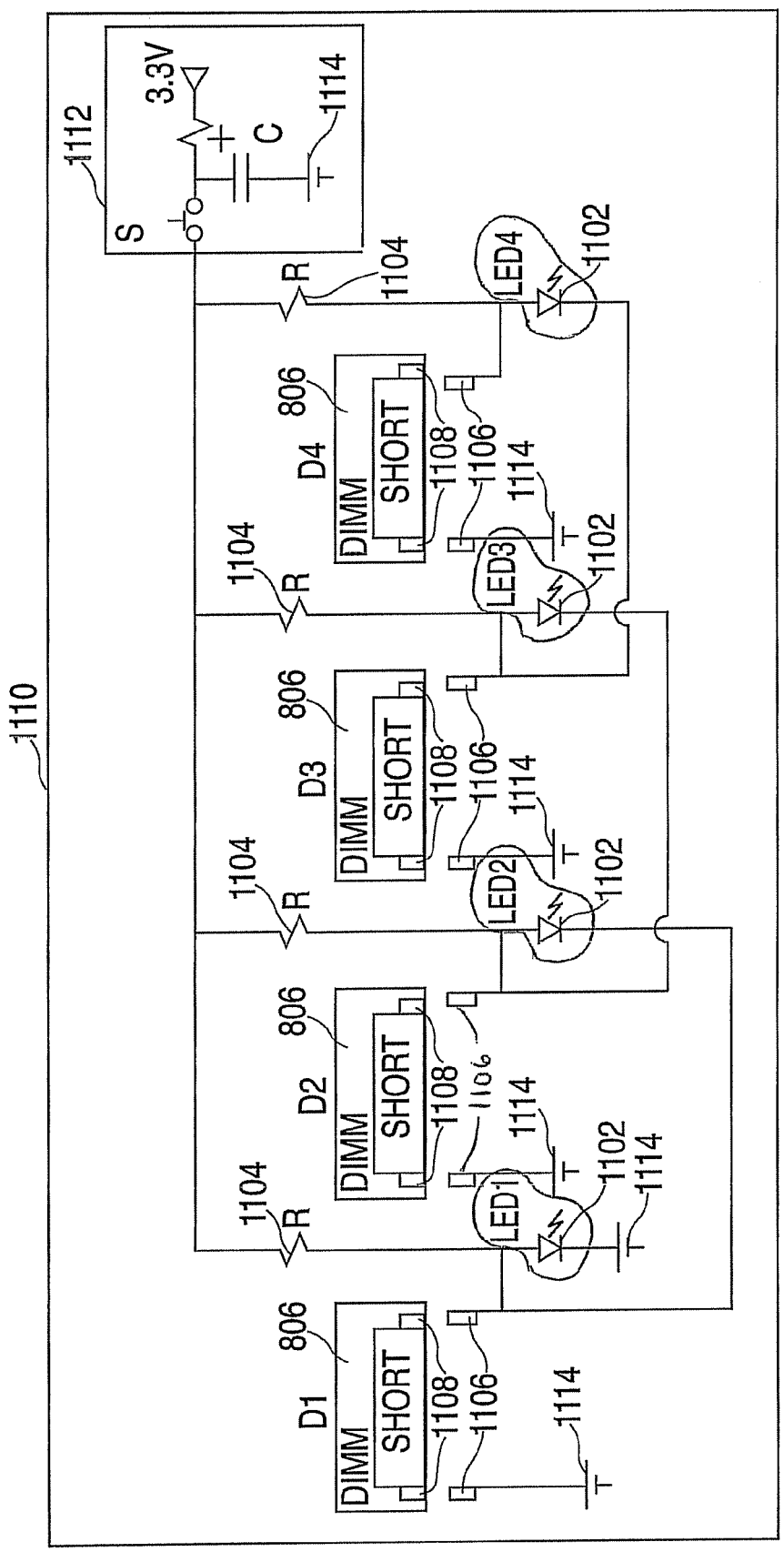
FIG. 11 is a block diagram of a memory system in accordance with exemplary embodiments of the present invention.

FIG. 11 is a block diagram of a memory system in accordance with exemplary embodiments of the present invention. The memory system includes a system board 1110 with a plurality of socket pads 1106 for plugging in memory modules 806. In the exemplary embodiment of the present invention depicted in FIG. 11, the socket pads 1106 are grouped into sets (e.g., sets of two) for plugging in each memory module 806. The memory system also includes a plurality of LEDs 1102 for indicating the proper positioning of the memory modules 806. Each LED 1102 is located next to a slot (containing a set of socket pads 1106) on the system board 1110 for receiving a memory module 806. Exemplary embodiments of the present invention are not limited to using an LEDs 1102 as an indicator; any indicator known in the art may be utilized including visual and audio indicators, such as an incandescent light bulb, a buzzer, a measuring device, such as a volt meter or a means of setting a system register that can be accessed by software for further processing and action. Several grounds 1114 are also depicted in FIG. 11.

The memory modules 806 include continuity pins 1108 (also referred to herein as DIMM tabs) for connecting the memory modules 806 to the socket pads 1106. Further, the memory system includes a power source 1112 for the LEDs 1102 located on the system board 1110 as shown in FIG. 11 or, alternatively, located externally to the system board 1110. The memory modules 806 (also referred to as "DIMMs") depicted in FIG. 11 are designed such that the continuity pins 1108, or DIMM tabs, at each end of the memory module 806 may be electrically shorted. FIG. 11 includes four DIMMS ("D1", "D2", "D3" and "D4") to be plugged into the system board 1110 in the sequence: D1 followed by D2 followed by D3 followed by D4. Initially, no memory modules are plugged in the system board 1110 (i.e., the socket pads 1106 are empty) so the circuitry would have power applied to the first LED 1102 labeled "LED1" indicating that the slot located proximate to the LED 1102 labeled LED1 should be plugged in first. When the indicator is an LED 1102, it is considered active when it is emitting light and inactive when it is not emitting light.

When the memory module 806 labeled D1 is plugged in to the system board 1110 (i.e., by connecting the continuity pins 1108 to the socket pads 1106), the LED 1102 labeled LED1 has its positive terminal shorted to ground via the continuity pins 1108 (short) on the memory module 806 labeled D1. The indicator LED1 is not emitting light and therefore inactive. Plugging the memory module 806 labeled D1 into the system board 1110 would also ground the negative terminal of the LED 1102 labeled "LED2" allowing it to be properly powered and lighted (i.e., the indicator is active) indicating that the memory module 806 labeled D2 is the next one in the sequence. This is continued for the remaining memory modules 806 in the schematic in FIG. 11, though the number of memory modules 806 that may be plugged into a system board 1110 has no defined limit.

The value of the resistors 1104 is selected to limit the current to the LEDs 1102. In an exemplary embodiment of the present invention, the value of the resistors 1104 is two hundred and twenty ohms, but as known in the art, other values may be utilized. If the memory module 806 is not properly seated such that both continuity pins 1108 male contact, the LEDs 1102 will not function, indicating an improperly plugged memory module 806.

In the block diagram contained in FIG. 11, the power source 1112 is a high value capacitor, labeled "C", pre-charged to some voltage (e.g., 3.3 volts) such that if a power supply is removed, a switch (labeled "S") can be active allowing the capacitor to be the voltage source for indication until discharged. In exemplary embodiments of the present invention, the power supply to the power source 1112 is supplied by the memory system (e.g., from a wall socket) and/or by a battery.

In alternate exemplary embodiments of the present invention, the LEDs 1102 are substituted for other sense circuitry to alert other portions of the system as to the status of the memory module 806 plugging sequence.

Exemplary embodiments of the present invention may be utilized to prevent incorrectly plugging a memory module either sequentially or with improper contact and initializing the system only to find out that it was done incorrectly. This avoids having to possibly disassemble the memory system, re-plug the memory module, reassemble the memory system, and re-test the memory system again, thus saving time (e.g., manufacturing system test time) and avoiding potential damage caused by the increased handling.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A memory system comprising:
a first and second set of socket pads adapted for connection to memory module continuity pins;
a first indicator corresponding to the first set of socket pads;
a second indicator corresponding to the second set of socket pads, wherein the first and second indicators are utilized to indicate that the first and second sets of socket pads are empty, that the first and second sets of socket pads contain the continuity pins, or that the first set of socket pads contain the continuity pins and the second set of socket pads is empty; and
a power source for the first and second indicators, wherein the first and second indicators are operable using the power source when the memory system is powered off.

2. The memory system of claim 1 wherein one or both of the first and second indicators are light emitting diodes (LEDs).

3. The memory system of claim 1 wherein one or both of the first and second indicators include one or more audio indicators.

4. The memory system of claim 1 wherein one or both of the first and second indicators cause a system register to be set.

5. The memory system of claim 1 wherein the memory module is a dual inline memory module (DIMM).

6. The memory system of claim 1 wherein the memory module is a buffered memory module.

7. The memory system of claim 1 wherein the power source is a battery.

8. The memory system of claim 1 wherein the power source is a wall socket.

9. The memory system of claim 1 wherein the power source includes a capacitor for providing power to the first and second indicators.

10. The memory system of claim 1 wherein the power source includes a switch for turning power on and off to the first and second indicators.

11. The memory system of claim 1 wherein the memory module is interconnected to a memory controller by a packetized multi-transfer interface via a memory bus.

12. A cascaded interconnect system comprising:
one or more memory modules including continuity pins;
a memory controller; and
a memory bus for directly interconnecting the memory modules and the memory controller by a packetized multi-transfer interface, wherein the memory bus includes a system board, the system board including:
a first and second set of socket pads adapted for connection to the continuity pins on the memory modules;
a first indicator corresponding to the first set of socket pads;
a second indicator corresponding to the second set of socket pads, wherein the first and second indicators are utilized to indicate one of that the first and second sets of socket pads are empty, that the first and second sets of socket pads contain the continuity pins, and that the first set of socket pads contain the continuity pins and the second set of socket pads is empty; and
a power source for the first and second indicators, wherein the first and second indicators are operable using the power source when the memory system is powered off.

13. The system of claim 12 wherein the memory modules have a dimension of about 6 inches long by about 1.5 inches tall.

14. The system of claim 12 wherein the memory modules have a dimension of 5.97 inches long by 1.2 inches tall.

15. The system of claim 12 wherein the first indicator and the second indicator are light emitting diodes (LEDs).

16. The system of claim 12 wherein one or both of the first and second indicators include one or more audio indicators.

17. The system of claim 12 wherein the memory module is a dual inline memory module (DIMM).

18. The system of claim 12 wherein the memory module is a buffered memory module.

19. A memory system comprising:
a plurality of socket pad sets adapted for connection to memory modules via memory module continuity pins;
a plurality of indicators corresponding to each of the socket pad sets;
a power source to enable operation of the indicators, the power source operable with a power supply and operable for a time period in the absence of the power supply;
wherein the indicators are utilized to indicate one or more of a next socket pad set available for memory module continuity pin insertion, an improper insertion of a memory module continuity pin in a socket pad set, no memory module continuity pins contained in one or more of the socket pad sets, and the power source is operating without the power supply.

20. The memory system of claim 19 wherein the indicators are light emitting diodes (LEDs).

* * * * *